(12) United States Patent
Anderson et al.

(10) Patent No.: US 10,269,657 B2
(45) Date of Patent: Apr. 23, 2019

(54) LATERALLY DIFFUSED METAL OXIDE SEMICONDUCTOR DEVICE INTEGRATED WITH VERTICAL FIELD EFFECT TRANSISTOR

(71) Applicant: INTERNATIONAL BUSINESS MACHINES CORPORATION, Armonk, NY (US)

(72) Inventors: Brent A. Anderson, Jericho, VT (US); Alain Loiseau, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/730,085

(22) Filed: Oct. 11, 2017

(65) Prior Publication Data
US 2018/0033786 A1 Feb. 1, 2018

Related U.S. Application Data

(63) Continuation of application No. 15/099,913, filed on Apr. 15, 2016, now Pat. No. 9,929,144.

(51) Int. Cl.
*H01L 27/148* (2006.01)
*H01L 29/80* (2006.01)
(Continued)

(52) U.S. Cl.
CPC ........... *H01L 21/823885* (2013.01); *H01L 21/823412* (2013.01); *H01L 21/823418* (2013.01);
(Continued)

(58) Field of Classification Search
CPC ......... H01L 29/66666; H01L 29/66681; H01L 29/66712; H01L 29/732; H01L 29/735;
(Continued)

(56) References Cited

U.S. PATENT DOCUMENTS 6,876,035 B2 4/2005 Abadeer et al.
6,903,421 B1 6/2005 Huang et al.
(Continued)

OTHER PUBLICATIONS

Yoo, A. et al., "A Low-Voltage Lateral SJ-FINFET with Deep-Trench p-Drift Region" IEEE Electron Device Letters (Aug. 2009) pp. 858-860, vol. 30, No. 8.
(Continued)

*Primary Examiner* — Hsien Ming Lee
(74) *Attorney, Agent, or Firm* — Tutunjian & Bitetto, P.C.; Vazken Alexanian

(57) ABSTRACT

An electrical device that in some embodiments includes a substrate including a lateral device region and a vertical device region. A lateral diffusion metal oxide semiconductor (LDMOS) device may be present in the lateral device region, wherein a drift region of the LDMOS device has a length that is parallel to an upper surface of the substrate in which the LDMOS device is formed. A vertical field effect transistor (VFET) device may be present in the vertical device region, wherein a vertical channel of the VFET has a length that is perpendicular to said upper surface of the substrate, the VFET including a gate structure that is positioned around the vertical channel.

13 Claims, 13 Drawing Sheets

(51) Int. Cl.
*H01L 21/8238* (2006.01)
*H01L 27/06* (2006.01)
*H01L 29/78* (2006.01)
*H01L 29/10* (2006.01)
*H01L 21/8234* (2006.01)
*H01L 27/088* (2006.01)
*H01L 29/06* (2006.01)
*H01L 29/66* (2006.01)
*H01L 21/84* (2006.01)
*H01L 27/12* (2006.01)

(52) U.S. Cl.
CPC ........ *H01L 21/823468* (2013.01); *H01L 21/823475* (2013.01); *H01L 21/823487* (2013.01); *H01L 21/823821* (2013.01); *H01L 21/823871* (2013.01); *H01L 21/823878* (2013.01); *H01L 27/0617* (2013.01); *H01L 27/088* (2013.01); *H01L 27/0886* (2013.01); *H01L 29/0649* (2013.01); *H01L 29/1095* (2013.01); *H01L 29/66666* (2013.01); *H01L 29/785* (2013.01); *H01L 29/7816* (2013.01); *H01L 29/7827* (2013.01); *H01L 29/7851* (2013.01); *H01L 21/823462* (2013.01); *H01L 21/84* (2013.01); *H01L 27/1203* (2013.01)

(58) Field of Classification Search
CPC ........... H01L 29/7371; H01L 29/7395; H01L 29/7787; H01L 29/7802; H01L 27/0886; H01L 27/0924; H01L 27/10841; H01L 27/11582; H01L 27/11556; H01L 27/1157; H01L 21/823431; H01L 21/823487; H01L 21/823821; H01L 21/823885
USPC ........ 257/220, 263, 328, 330, 331; 438/156, 438/173, 192, 212, 268
See application file for complete search history.

(56) References Cited

U.S. PATENT DOCUMENTS

| | | | |
|---|---|---|---|
| 8,138,544 B2* | 3/2012 | Seliskar | ........ H01L 21/845 257/330 |
| 8,168,490 B2 | 5/2012 | Hebert | |
| 8,564,031 B2 | 10/2013 | Huang et al. | |
| 9,006,811 B2 | 4/2015 | Meiser et al. | |
| 9,041,127 B2 | 5/2015 | Campi, Jr. et al. | |
| 9,929,144 B2* | 3/2018 | Anderson | ........ H01L 27/0617 |
| 2012/0193707 A1 | 8/2012 | Huang et al. | |
| 2013/0307513 A1 | 11/2013 | Then et al. | |
| 2015/0162439 A1 | 6/2015 | Hoentschel et al. | |
| 2015/0206975 A1 | 7/2015 | Meiser et al. | |

OTHER PUBLICATIONS

U.S. Office Action issued in U.S. Appl. No. 16/102,955, dated Jan. 24, 2019, pp. 1-29.

* cited by examiner

LATERALLY DIFFUSED METAL OXIDE SEMICONDUCTOR DEVICE INTEGRATED WITH VERTICAL FIELD EFFECT TRANSISTOR

BACKGROUND

Technical Field

The present disclosure relates to methods of forming semiconductor devices and the electronic device structures produced thereby, and more particularly to a method of epitaxially forming the drain, channel, and source of a vertical finFET.

Description of the Related Art

A Field Effect Transistor (FET) typically has a source, a channel, and a drain, where current flows from the source to the drain, and a gate that controls the flow of current through the channel. The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements.

SUMMARY

In one aspect, the present disclosure provides an electrical device that includes a substrate including a lateral device region and a vertical device region. A first semiconductor device in the lateral device region, wherein a lateral channel region of the first semiconductor device has a length that is parallel to an upper surface of the substrate in which the first semiconductor device is formed. A second semiconductor device is present in the vertical device region, wherein a vertical channel has a length that is perpendicular to said upper surface of the substrate, the second semiconductor device including a gate structure that is positioned around the vertical channel.

In another embodiment, the electrical device includes a substrate including a lateral device region and a vertical device region. A lateral diffusion metal oxide semiconductor (LDMOS) device is present in the lateral device region, wherein a diffusion region of the LDMOS device has a length that is parallel to an upper surface of the substrate in which the LDMOS device is formed. A vertical field effect transistor (VFET) device is present in the vertical device region, wherein a vertical channel of the VFET has a length that is perpendicular to said upper surface of the substrate, the VFET including a gate structure that is positioned around the vertical channel.

In yet another aspect of the present disclosure, a method of forming an electrical device is provided. In one embodiment, the method includes forming at least one first fin structure in a lateral device region of a substrate and forming at least one second fin structure in a vertical device region of the substrate. A drift region is formed in the lateral device region and a dopant region is formed in the vertical device region of the substrate for the first of a source region and drain region. A dielectric layer is formed in the lateral device region of the substrate and the vertical device region of the substrate. A first portion of the dielectric layer provides a gate dielectric for a LDMOS device being formed in the lateral device region. A second portion of the dielectric spacer provides a spacer for the VFET. A gate structure is formed for the LDMOS devices and the VFET devices. An epitaxial semiconductor material is formed on the at least one first fin structure in the lateral device region of the substrate and the at least one second fin structure in the vertical device region of the substrate. The epitaxial semiconductor material in the lateral device region may provide dopant region for one of source region or drain region for the LDMOS device. The epitaxial semiconductor material in the vertical device region provides a doped region for a second of the source region and drain region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
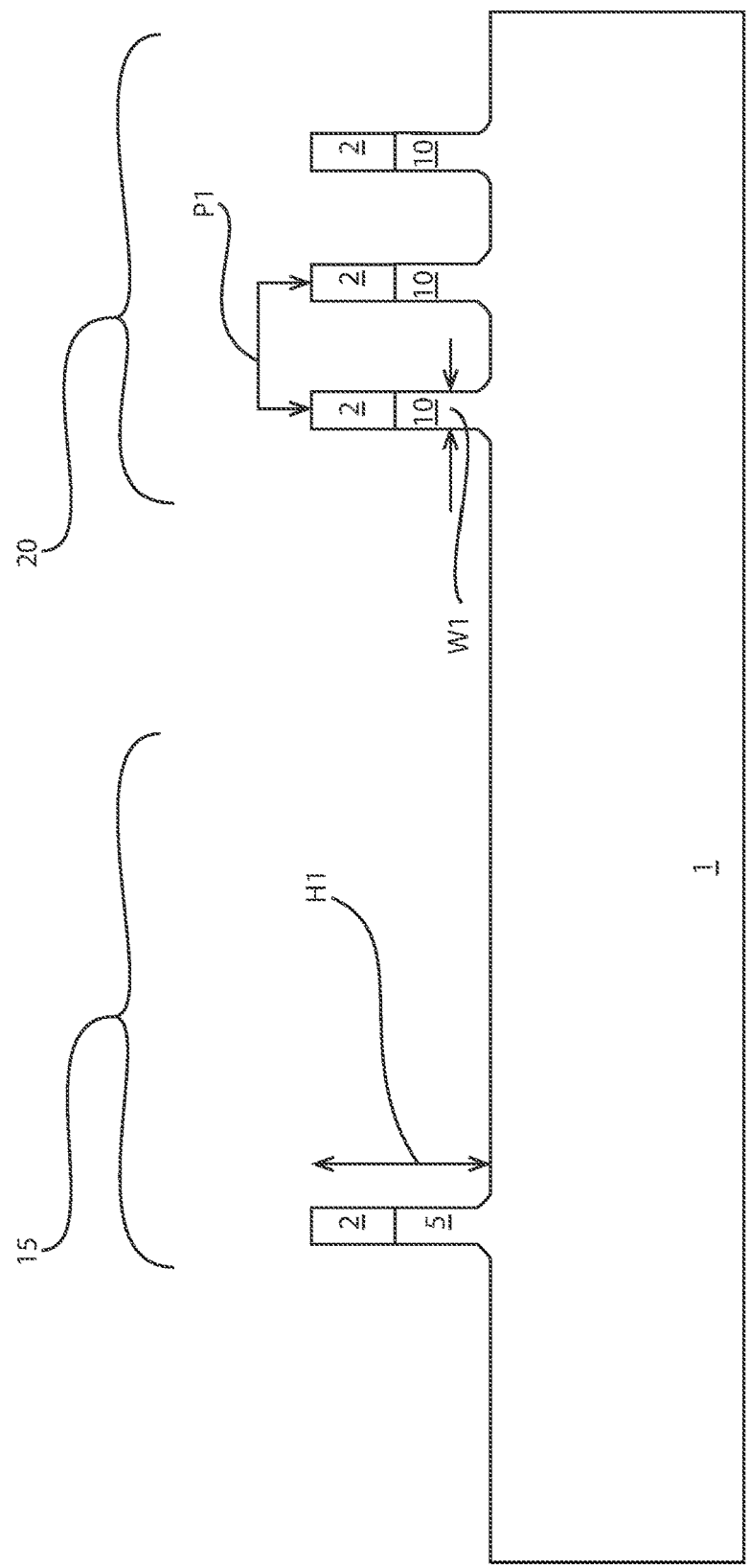
FIG. 1 is a side cross-sectional view of a substrate that has been etched to provide at least one first fin structure in a lateral device region and at least one second fin structure in a vertical device region, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a Vertical Fin Field Effect Transistor (VFET) in combination with a Lateral Diffusion Metal Oxide Semiconductor (LDMOS) device on the same semiconductor substrate. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. The source and drain regions of the fin structure are the portions of the fin structure that are on opposing sides of the channel region of the fin structure.

In an embodiment, a finFET semiconductor device has the drain, fin channel, and source device components arranged perpendicular to the plane of the substrate surface, which is referred to as a vertical stack. A vertically stacked finFET, i.e., Vertical FinFET (VFinFET), can have a longer gate length (i.e., height) and larger dielectric spacer than a horizontal (i.e., having the drain, fin channel, and source device components arranged parallel with the plane of the substrate surface) finFET having comparable contact gate pitch.

The Laterally Diffused MOSFET (LDMOS) is an asymmetric power MOSFET that in some examples can be designed for low on-resistance and high blocking voltage. These features can be obtained by creating a diffused first conductivity type channel region, e.g., p-type channel region, in a low-doped second conductivity type drain region, e.g., n-type drain region. The low doping on the drain side results in a large depletion layer with high blocking voltage. In some examples, the channel region diffusion can be defined with the same mask as the source region, resulting in a short channel with high current handling capability. The LDMOS structure combines a short channel length with high breakdown voltage as desired for high power RF amplifiers, e.g., ranging from 10 MHz to 3.8 GHz, in numerous applications. This device is currently the device of choice for RF power amplifiers in base stations of wireless communications systems as well as numerous UHF and L-band power amplifiers in broadcast, communication and radar systems. The methods and structures disclosed herein integrate LDMOS devices with VFETs. The methods and structures of the present disclosure are now described with greater detail with reference to FIGS. 1-16B.

FIG. 1 depicts one embodiment of a substrate 1 that has been etched to provide at least one first fin structure 5 in a lateral device region 15, and at least one second fin structure 10 in a vertical device region 20 of the substrate 1. In various embodiments, the substrate 1 may be a semiconductor. The substrate 1 may be crystalline. The substrate 1 may be primarily (i.e., with doping) of a single element, for example, silicon (Si) or germanium, (Ge), or the substrate 1 may be a compound, for example, GaAs, SiC, or SiGe. The substrate 1 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 1 may also have other layers forming the substrate, including high-k oxides and/or nitrides. In one or more embodiments, the substrate 1 may be a silicon wafer. In an embodiment, the substrate is a single crystal silicon wafer.

The substrate 1 includes a first device region, also referred to as lateral device region 15, in which the LDMOS device is to be formed, and a second device region, also referred to as a vertical device region 20, in which the VFET is to be formed.

The substrate 1 may be processed to provide fin structures 5, 10. The fin structures 5, 10 are typically formed using deposition, photolithography, i.e., patterning, and etch processes. In one embodiment, the patterning process used to define each of the fin structures 5, 10 is a sidewall image transfer (SIT) process. The SIT process can include forming a first mandrel material layer (not shown) on the material layer that provides the fin structures 5, 10. The first mandrel material layer can include any material (semiconductor, dielectric or conductive) that can be selectively removed from the structure during a subsequently performed etching process. The first mandrel material layer can be formed by a deposition method, such as chemical vapor deposition or plasma enhanced chemical vapor deposition. In one embodiment, the thickness of the first mandrel material layer can be from 50 nm to 300 nm. Following deposition of the first mandrel material layer, the first mandrel material layer can be patterned by lithography and etching to form a plurality of first mandrel structures on the topmost surface of the semiconductor containing material that provides the fin structures 10, e.g., the upper surface of the semiconductor substrate 1.

In some embodiments, the SIT process may continue by forming a dielectric spacer on each sidewall of each of the first mandrel structures. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5, 10.

In some embodiments, after formation of the dielectric spacers, the SIT process continues by removing each the first mandrel structure. Each of the first mandrel structures can be removed by an etching process that is selective for removing the mandrel material as compared to semiconductor material of the substrate that provides the fin structures 5, 10, e.g., silicon (Si). Following the first mandrel structure removal, the SIT process continues by transferring the pattern provided by the dielectric spacers into the semiconductor material layer that provides the fin structures 5, 10, such as the upper surface of semiconductor substrate 1. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor substrate 1 to provide the fin structures 10, 15. Following etching, i.e., pattern transfer, the SIT process may conclude with removing the dielectric spacers using an etch process or a planarization process.

It is noted that the aforementioned spacer image transfer (SIT) process is only one method of forming the fin structures 5, 10. In another embodiment, each of the fin structures 5, 10 may be formed using a photoresist etch mask. Specifically, in one example, a photoresist mask is formed overlying the semiconductor composition layer which provides the fin structures 5, 10. The exposed portions of the semiconductor layer that provides the fin structures 5, 10 that are not protected by the photoresist mask are removed using a selective etch process. To provide the photoresist mask, a photoresist layer is first positioned on the portion of the semiconductor substrate 1 that provides the fin structures 5, 10. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor substrate 1 that provides the fin structures 5, 10, e.g., selectively etch the unprotected portions. The etch process may be an anisotropic process, such as reactive ion etch (RIE).

In some embodiments, each of the fin structures 5, 10 may have a height H1 ranging from 5 nm to 200 nm. In another embodiment, each of the plurality of fin structures 5, 10 has a height H1 ranging from 10 nm to 100 nm. In one example, each of the plurality of fin structures 10 has a height H1 ranging from 20 nm to 50 nm. Each of the plurality of fin structures 10 may have a width W1 of less than 20 nm. In another embodiment, each of the plurality of fin structures 10 has a width W1 ranging from 3 nm to 15 nm.

Although one fin structure is depicted in the lateral device region 15, and three fin structures are depicted in the vertical device region 20 that is depicted in FIG. 1, the present disclosure is not limited to only this example. It is noted that any number of fin structures 5, 10 may be present in the lateral device region 15 and the vertical device region 20 of the substrate 1. The pitch P1 separating adjacent fin structures 10 in the vertical device region 20 may range from 15 nm to 500 nm. In another example, the pitch P1 separating adjacent fin structures 10 in the vertical device region 20 may range from 20 nm to 50 nm.

The fin structure 10 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon. One example of a compound semiconductor composition that may provide the fin structures 10 is a type III-V semiconductor. Typically, the III-V compound semiconductors are binary, ternary or quaternary alloys including III/V elements. Examples of III-V compound semiconductors that can be used for the composition of the fin structures 5, 10 include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof. Typically, the fin structures are not doped with n-type or p-type dopant via external doping methods.

Still referring to FIG. 1, a dielectric cap 2 may be present atop each of the fin structures 5, 10. The dielectric cap 2 may be composed of an oxide, nitride or oxynitride material, and may be formed as part of the process sequence that forms the fin structures 5, 10. For example, when the dielectric cap 2 is composed of an oxide, the oxide may be silicon oxide. For example, when the dielectric cap 2 is composed of a nitride, the nitride may be silicon nitride.

Figure 2:
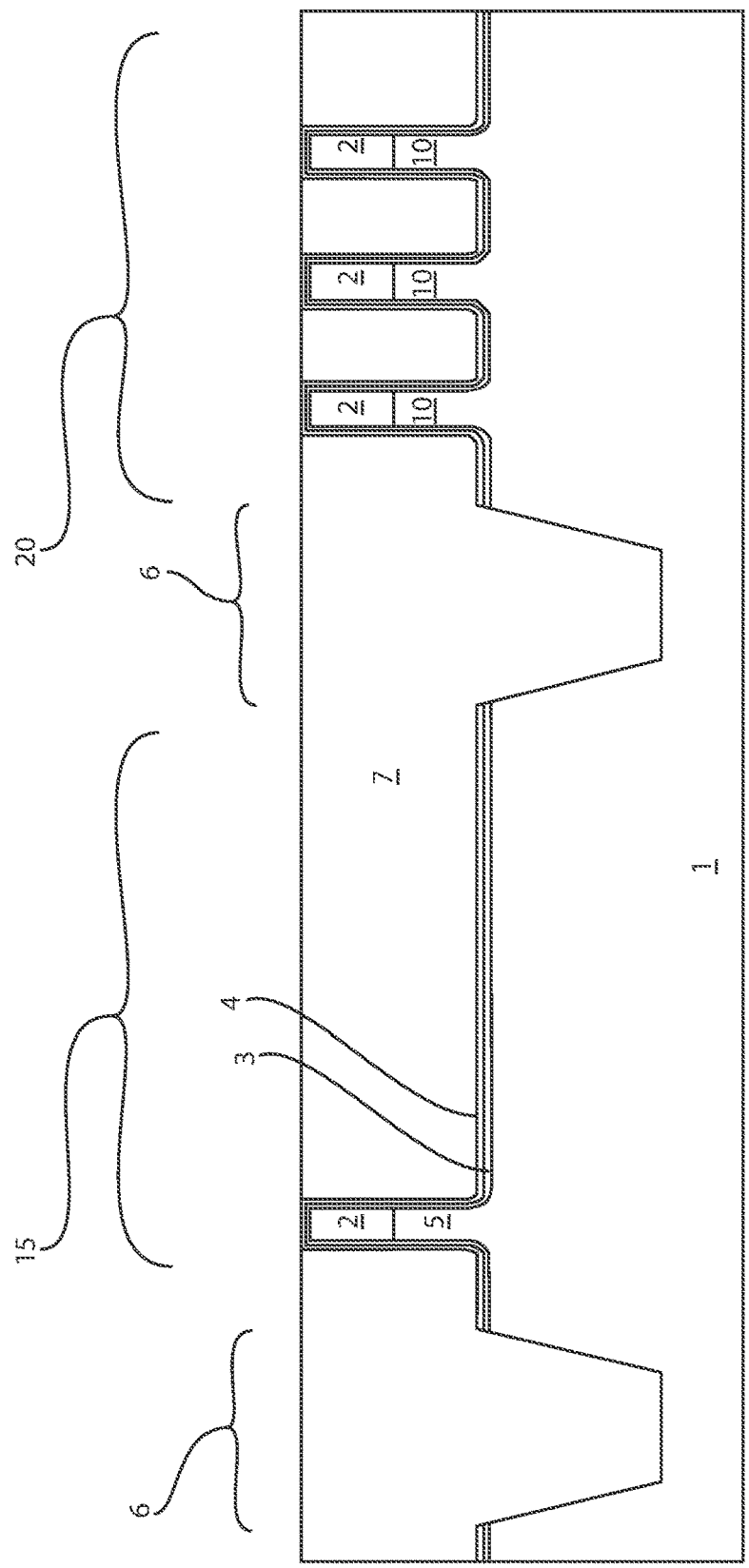
FIG. 2 is a side cross-sectional view of forming at least one conformal dielectric layer on the fin structures, and forming isolation regions separating the lateral device region from the vertical device region, in accordance with one embodiment of the present disclosure.

FIG. 2 depicts one embodiment of forming at least one conformal dielectric layer 3, 4 on the fin structures 5, 10, and forming isolation regions 6 separating the lateral device region 15 from the vertical device region 20. The term "conformal layer" denotes a layer having a thickness that does not deviate from greater than or less than 30% of an average value for the thickness of the layer. In some examples, the at least one conformal dielectric layer 3, 4 is a bilayer of an oxide containing layer 3 and a nitride containing layer 4. The oxide containing layer 3 may be blanket deposited atop the structure depicted in FIG. 1 including the fin structures 5, 10 and the upper surface of the semiconductor substrate that is separating the adjacent fin structures 5, 10. In one example, the oxide containing layer 3 may be composed of silicon oxide. The nitride containing layer 4 may be blanket deposited atop the oxide containing layer. In one example, the nitride containing layer 4 is composed of silicon nitride. To provide the conformal layer for the oxide containing layer 3 and the nitride containing layer 4, the at least one conformal dielectric layer 3, 4 may be deposited using chemical vapor deposition (CVD) or atomic layer deposition (ALD). In some embodiments, the thickness for each of the oxide containing layer 3 and the nitride containing layer 4 may range from 0.5 nm to 15 nm. In other embodiments, the thickness for each of the oxide containing layer 3 and the nitride containing layer 4 may range from 1 nm to 5 nm.

Still referring to FIG. 2, isolation regions 6 may be formed separating the lateral device region 15 from the vertical device region 20. Forming the isolation regions 6 may include forming a first dielectric layer atop the at least one conformal dielectric layer 3, 4, and planarizing the first dielectric layer so that the upper surface of the first dielectric layer is coplanar with the upper surface of the dielectric cap 2. The planarization process may be provided by chemical mechanical planarization (CMP). The first dielectric layer and the portions of the substrate 1 at the interface between the lateral device region 15 and the vertical device region 20 may then be etched with a shallow trench isolation region etch for forming a trench structure. The etch process may including forming a photoresist mask and then applying an anisotropic etch, such as reactive ion etch (RIE), for forming the trench structure. The trench structure may then be filled with an insulating dielectric, such as silicon oxide, which may be deposited using a chemical vapor deposition (CVD) process, such as plasma enhanced chemical vapor deposition.

Figure 3:
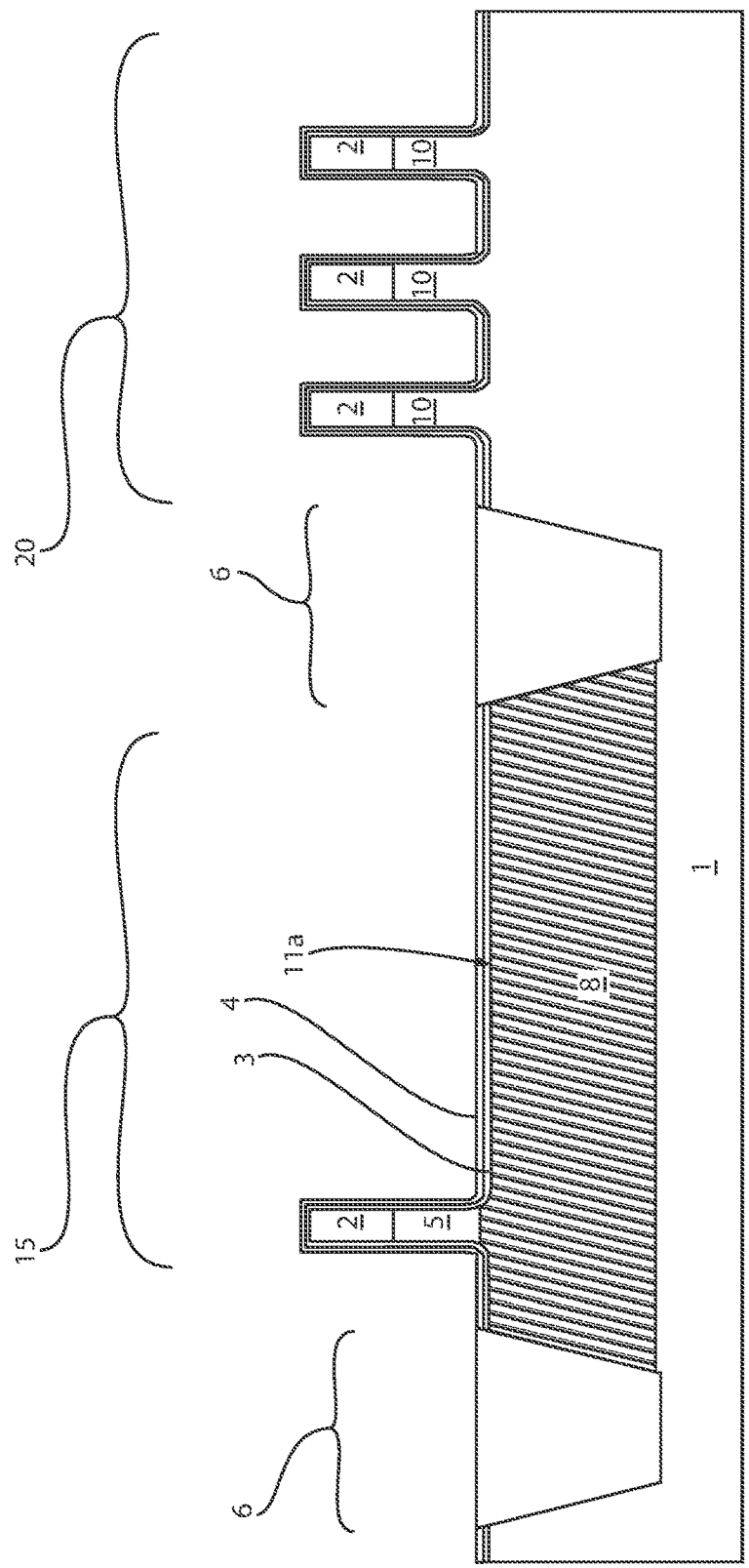
FIG. 3 is a side cross-sectional view depicting one embodiment of forming a drift region in the lateral device region of the substrate, in accordance with the present disclosure.

FIG. 3 depicts one embodiment of forming a drift region 8 in the lateral device region 15 of the substrate 1. The drift region 8 is a component of the LDMOS device is present in the portion of the substrate 1 within the lateral device region 15 between the isolation regions 6. The drift region is typically doped with a conductivity type dopant that is opposite the conductivity type of the LDMOS device. The term "conductivity type" denotes whether the dopant provides a p-type conductivity or an n-type conductivity. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous.

For example, in one embodiment, in which the LDMOS device has an n-type conductivity, the drift region 8 may be doped to a p-type conductivity. In another example, when the LDMOS device has a p-type conductivity, the drift region 8 may be doped to an n-type conductivity.

Before forming the drift region 8, the first dielectric layer may be recessed to reveal the fin structures 5, 10. Recessing the first dielectric layer can include a selective etch process, such as a wet chemical etch, or a dry etch, such as reactive ion etch (RIE). The etch process may be selective to the at least one conformal dielectric layer 3, 4 that is present on the fin structures 5, 10.

To provide the drift region 8 in the lateral device region 15, a first block mask may be formed over the vertical device region 20, and the dopant that provides the selected conductivity type is implanted into the exposed lateral device region 15. In some embodiments, the first block mask may be a photoresist mask that is formed using photolithography and development processes. In one embodiment, the dopant that provides the conductivity type may be doped into the portion of the semiconductor substrate 1 in which the drift region 8 is formed at a concentration ranging from $1 \times 10^{11}$ atoms/cm$^3$ to $1 \times 10^3$ atoms/cm$^3$. In another embodiment, the dopant that provides the conductivity type may be doped into the portion of the semiconductor substrate 1 in which the drift region 8 is formed at a concentration ranging from $5 \times 10^{11}$ atoms/cm$^3$ to $5 \times 10^{12}$ atoms/cm$^3$. In one example, the dopant that provides the conductivity type may be doped into the portion of the semiconductor substrate 1 in which the drift region 8 is formed at a concentration of $1 \times 10^{12}$ atoms/cm$^3$.

Following ion implantation of the dopant for the drift region 8, the structure is annealed. The anneal process may be provided by thermal anneal, such as rapid thermal anneal (RTA), laser annealing, IR heating, furnace annealing and combinations thereof. The anneal process for forming the drift region 8 may be at a temperature ranging from 800° C. to 1100° C. Following formation of the drift region 8, the first block mask that was formed over the vertical device region 20 is removed.

Figure 4:
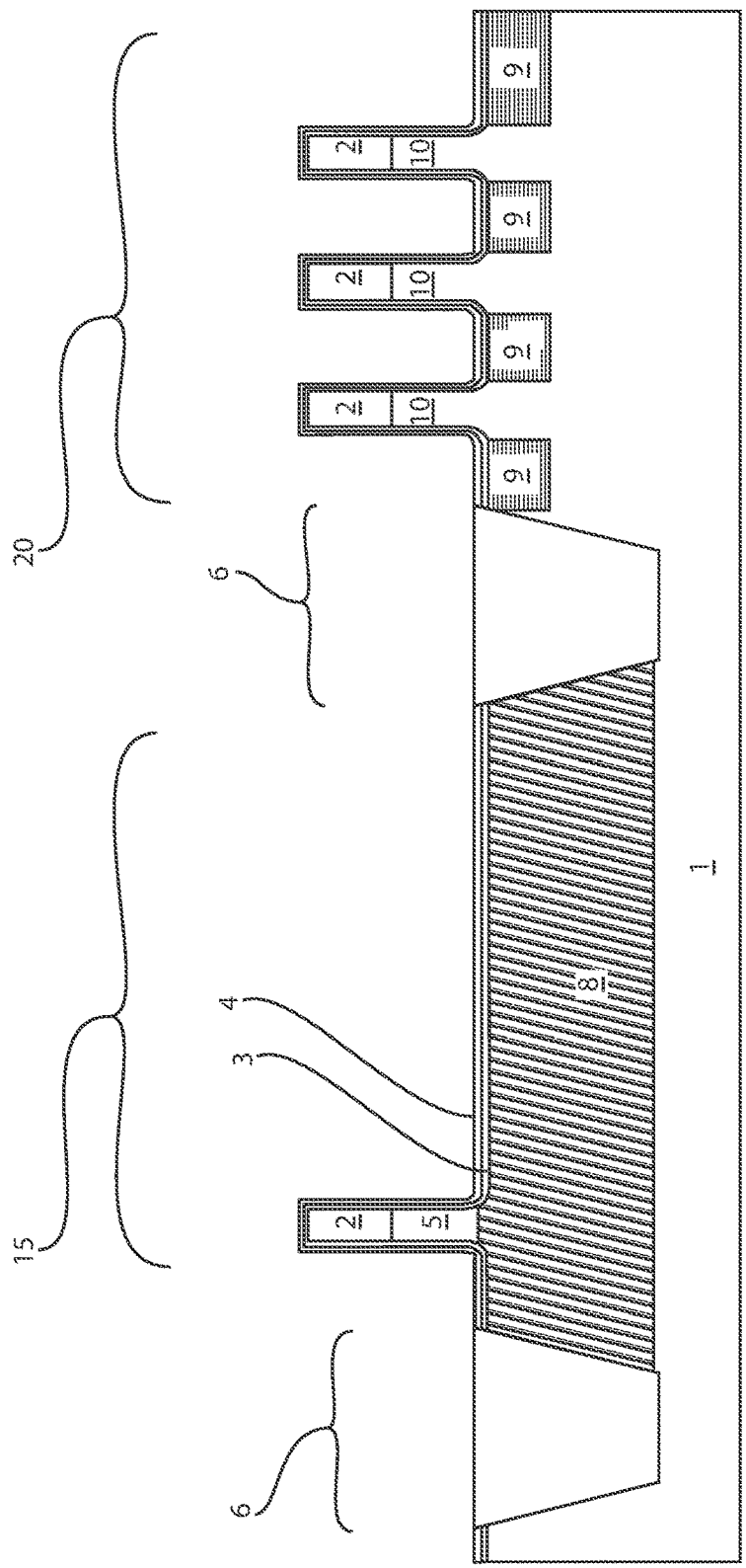
FIG. 4 is a side cross-sectional view depicting one embodiment of forming a first of a source region and a drain region in the vertical device region of the substrate, in accordance with one embodiment of the present disclosure.

FIG. 4 depicts one embodiment of forming a dopant region 9 for a first of a source region and a drain region in the vertical device region 20 of the substrate 1. By a first of the source region and the drain region, it is meant that dopant region provides one of a source region or a drain region, and the other of the source or drain region is formed on an opposing side of the fin structure 10. For example, when the doped region 9 is a source region, the drain region is formed on the opposing surface, i.e., upper surface of the fin structure 10. In another example, when the doped region is a drain region, the source region is formed on the opposing surface, i.e., upper surface of the fin structure 10. Typically, the conductivity type for the doped region 9 dictates the conductivity type of the VFET. For example, when the doped region 9 is implanted to an n-type conductivity, the VFETs are n-type semiconductor devices. For example, when the doped region 9 is implanted to a p-type conductivity, the VFETs are p-type semiconductor devices.

To provide the dopant region 9 in the vertical device region 20, a second block mask may be formed over the lateral device region 15, and the dopant that provides the selected conductivity type for the VFETs is implanted into the exposed vertical device region 20. In some embodiments, the second block mask may be a photoresist mask that is formed using photolithography and development processes. In one embodiment, the dopant that provides the conductivity type for the VFETs may be doped into the portion of the semiconductor substrate 1 between the fin structures 10 to provide the doped region 9 for a first of a source region and a drain region at a concentration ranging from $5 \times 10^{19}$ atoms/cm$^3$ to $5 \times 10^{21}$ atoms/cm$^3$. In another embodiment, the dopant that provides the conductivity type for the VFETs may be doped into the portion of the semiconductor substrate 1 between the fin structures 10 to provide the doped region 9 for a first of a source region and a drain region at a concentration ranging from $5 \times 10^{19}$ atoms/cm$^3$ to $5 \times 10^{20}$ atoms/cm$^3$.

Following ion implantation of the dopant for the doped region 9 for a first of a source region and a drain region, the structure is annealed to provide a diffused dopant region 9'. The anneal process may be provided by thermal anneal, such as rapid thermal anneal (RTA), laser annealing, IR heating, furnace annealing and combinations thereof. The anneal process for forming the doped region 9 may be at a temperature ranging from 800° C. to 1100° C. Following formation of the doped region 9, the block mask that was formed over the lateral device region 15 is removed.

Figure 5:
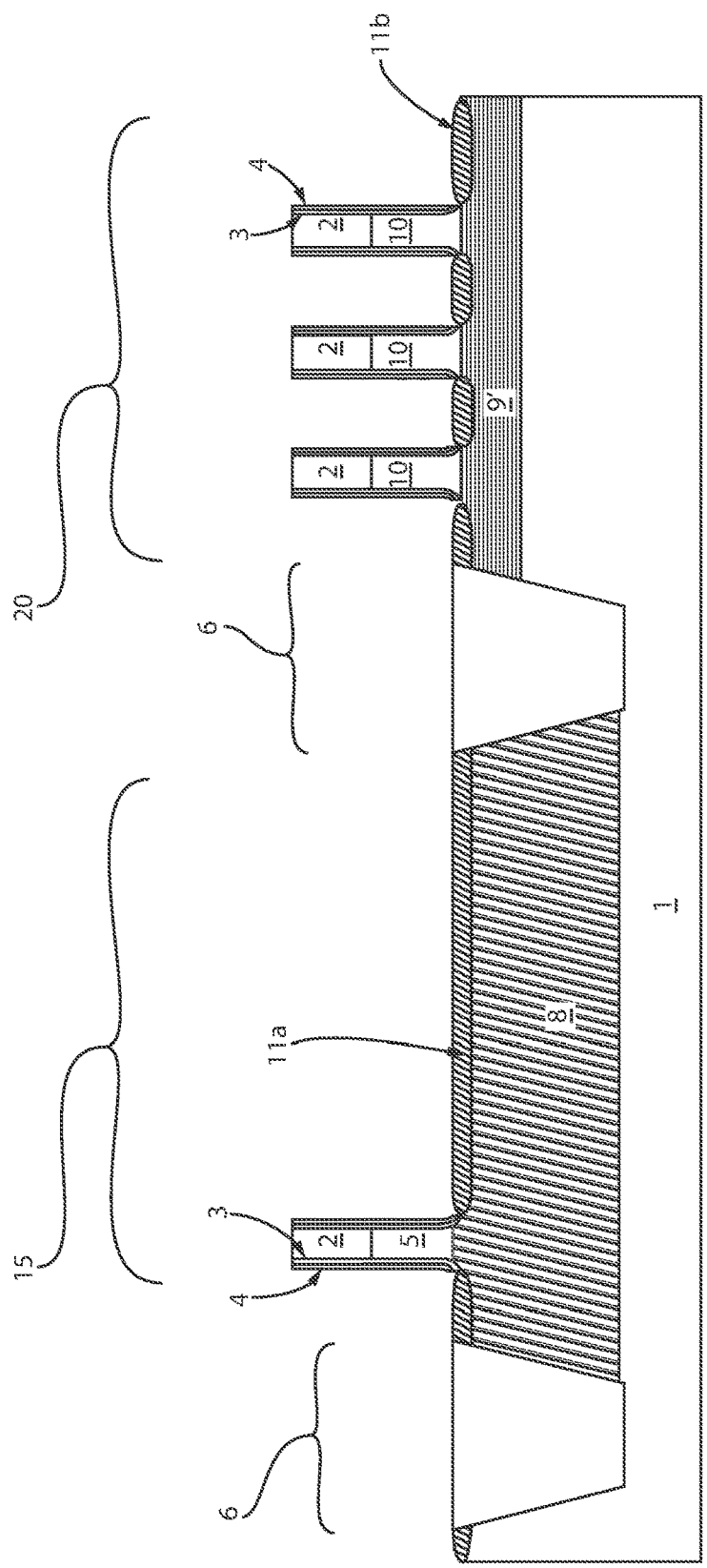
FIG. 5 is a side cross-sectional view depicting one embodiment of forming a dielectric layer in the lateral device region of the substrate and the vertical device region of the substrate, wherein a first portion of the dielectric layer provides a drift region gate dielectric for a LDMOS device being formed in the lateral device region, and a second portion of the dielectric spacer provides a spacer for the VFET being formed in the vertical device region.

FIG. 5 depicts one embodiment of forming a dielectric layer 11a, 11b in the lateral device region 15 of the substrate 1 and the vertical device region 20 of the substrate 1, wherein a first portion of the dielectric layer 11a provides a drift region gate dielectric for a LDMOS device being formed in the lateral device region 15, and a second portion of the dielectric layer 11b provides a spacer for the VFET being formed in the vertical device region 20.

In some embodiments, before the dielectric layer 11a, 11b is deposited, the at least one conformal dielectric layer 3, 4 may be removed from the upper surfaces of the portions of the substrate separating the fin structures 5, 10. The at least one conformal dielectric layer 3, 4 may be removed using an etch process that is selective to the fin structures 5, 10 and the substrate 1. In some embodiments, the lateral portions of the at least one conformal dielectric layer 3, 4, i.e., the portions of the conformal dielectric layer 3, 4 that are present on the upper surfaces of the substrate 1 and the upper surface of dielectric cap 2 overlying the fin structures 5, 10 is removed by an anisotropic etch, such as reactive ion etch (RIE).

The dielectric layer 11a, 11b may be an oxide or a nitride dielectric layer. For example, the dielectric layer 11a, 11b may be composed of silicon oxide. In other examples, the dielectric layer 11a, 11b may be composed of a nitride, such as silicon nitride. In yet other embodiments, the dielectric layer 11a, 11b may be composed of a high-k dielectric material. As used herein, "high-k" denotes a dielectric material featuring a dielectric constant (k) higher than the dielectric constant of SiO$_2$ at room temperature. For example, the dielectric layer 11a, 11b may be composed of a high-k oxide such as, for example, HfO$_2$, ZrO$_2$, Al$_2$O$_3$, TiO$_2$, La$_2$O$_3$, SrTiO$_3$, LaAlO$_3$, Y$_2$O$_3$ and mixtures thereof. Other examples of high-k dielectric materials for the at least one gate dielectric include hafnium silicate, hafnium silicon oxynitride or combinations thereof.

The dielectric layer 11a, 11b may be formed using a deposition process, such as chemical vapor deposition (CVD) or atomic layer deposition (ALD), or may be formed using a growth process, such as thermal oxidation. The dielectric layer 11a, 11b, may have a thickness ranging from 2 nm to 20 nm. In some examples, the dielectric layer 11a, 11b may have a thickness ranging from 2 nm to 10 nm.

[[Normally the Thick Oxide is Formed First and then the Thin (Critical Oxide) is Formed on Top of the Thick.]]

Figure 6:
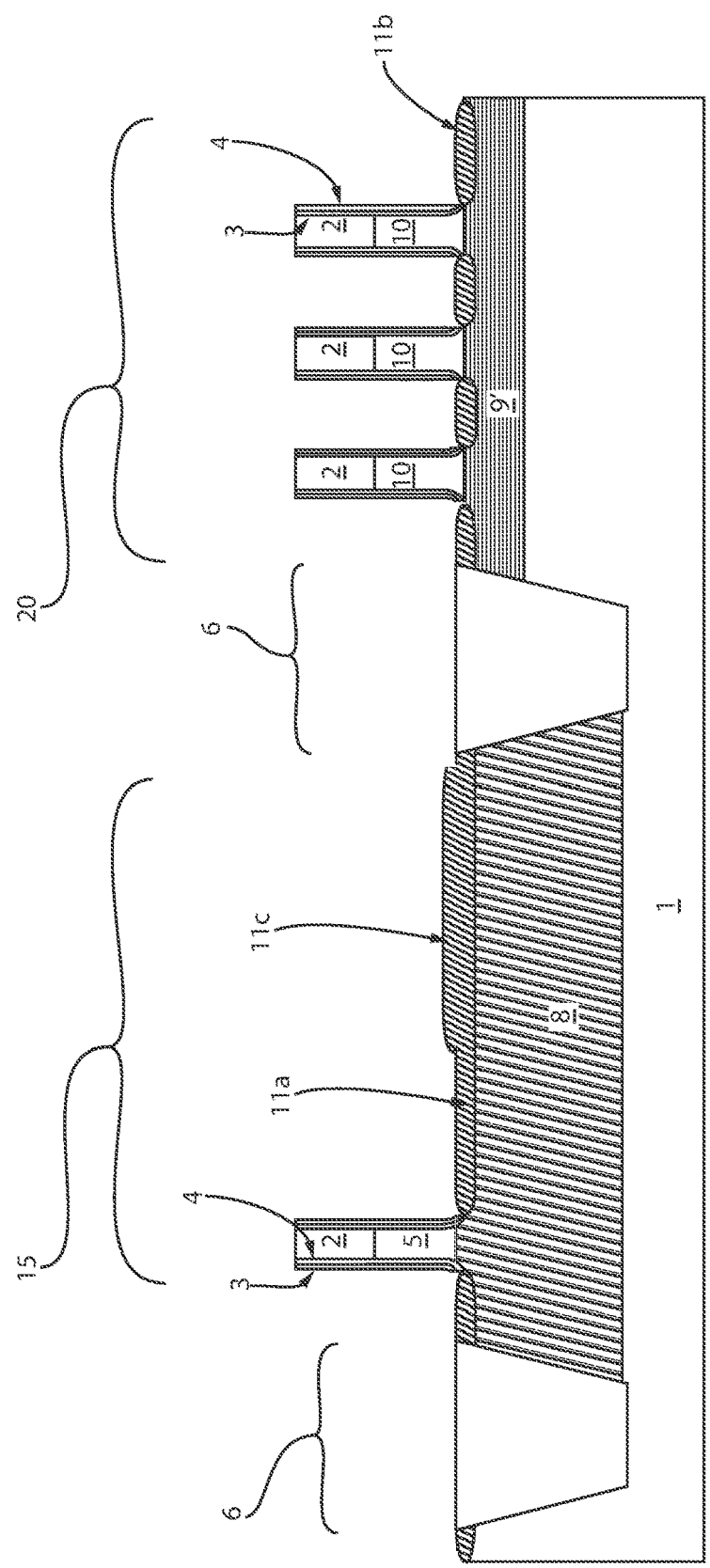
FIG. 6 is a side cross-sectional view of forming a thickened portion of the dielectric layer in the lateral device region, in accordance with one embodiment of the present disclosure.

FIG. 6 depicts one embodiment of an optional step of increasing the thickness of a portion of the dielectric layer 11a that is present in the lateral device region 10, wherein the thickness of the dielectric layer 11a is being increased for applications in higher voltages. In some embodiments, the portion of the dielectric layer 11c having the greater thickness does not extend across the entire portion of the dielectric layer 11a that is present in the lateral device region 10. The portion of the dielectric layer 11c having the greater thickness may be selectively formed by using a block mask, e.g., a photoresist mask, that is covering the portions of the structure depicted in FIG. 5 in which additional dielectric deposition is not desired. The block mask has an opening exposing the portion of the dielectric layer 11a on which addition dielectric material is to be formed producing the greater thickness dielectric layer 11a. The greater thickness dielectric layer 11c typically has the same composition as the dielectric layer 11a that is present in the lateral device region 10. The greater thickness dielectric layer 11c is typically formed using thermal growth or a deposition process, such as chemical vapor deposition (CVD) or atomic layer deposition (ALD). The greater thickness dielectric layer 11c may have a thickness ranging from 5 nm to 25 nm. In other embodiments, the thickness of the greater thickness dielectric layer 11c may range from 6 nm to 12 nm. It is noted that the process step depicted in FIG. 6, as well as the resulting greater thickness dielectric layer 11c, is optional and may be omitted. Further, although FIGS. 7-10 illustrate a process that does not employ the optional steps and structures depicted in FIG. 6, the methods and structures depicted in FIGS. 7-10 are equally applicable to the embodiments including the optional method steps and structures that are depicted in FIG. 6.

Figure 7:
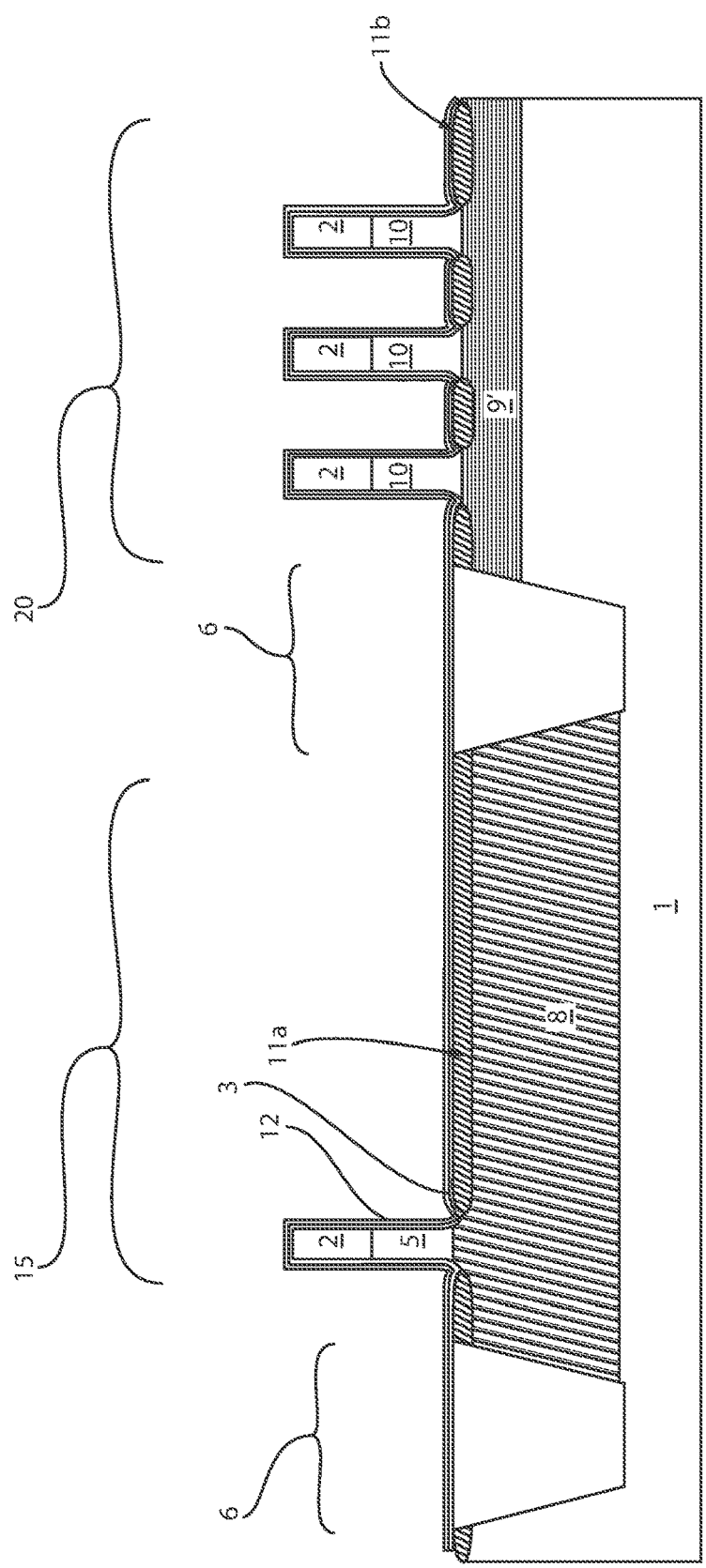
FIG. 7 is a side cross-sectional view depicting one embodiment of forming a gate dielectric on the fin structures, in accordance with the present disclosure.

FIG. 7 depicts one embodiment of forming a gate dielectric 12 on the fin structures 5, 10. Forming the gate dielectric 12 may include removing at least a portion of the at least one conformal dielectric layer 3, 4. The at least one conformal dielectric layer 3, 4 may be removed by an etch process. For example, the at least one conformal dielectric layer 3, 4 may be removed by an etch that is selective to the fin structure 5, 10 and the dielectric layer 11a, 11b, 11c (when present). The etch process may be a wet chemical etch, or a dry etch, such as reactive ion etch (RIE).

In a following process step, the gate dielectric 12 may be formed on the fin structures, as well as the dielectric layer 11a, 11b, 11c (when present). Typically, the gate dielectric is formed using a conformal deposition process. The gate dielectric may be composed of any dielectric material, such as an oxide, nitride or oxynitride material. In some embodiments, the gate dielectric is a high-k dielectric material. For example, the least one gate dielectric layer may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric include hafnium silicate, hafnium silicon oxynitride or combinations thereof.

To provide the conformal layer, the gate dielectric 12 may be deposited using atomic layer deposition (ALD). In other embodiments, the gate dielectric 12 may be deposited using chemical vapor deposition methods, such as plasma enhanced chemical vapor deposition (PECVD). In one embodiment, the thickness of the at least one gate dielectric layer 12 is greater than 0.8 nm. More typically, the at least one gate dielectric layer 12 has a thickness ranging from about 1.0 nm to about 6.0 nm.

In some embodiments, conformal deposition of the gate dielectric 12 produces a vertical gate dielectric on the channel portion of the fin structures 10 in the vertical device region 20 for the VFETs. In some embodiments, the conformal deposition of the gate dielectric 12 produces a vertical portion of the gate dielectric that is present on the fin structure 5 and leads to a lateral portion of the gate dielectric for the LDMOS that is provided by the dielectric layer 11a overlying the drift region 8.

Figure 8:
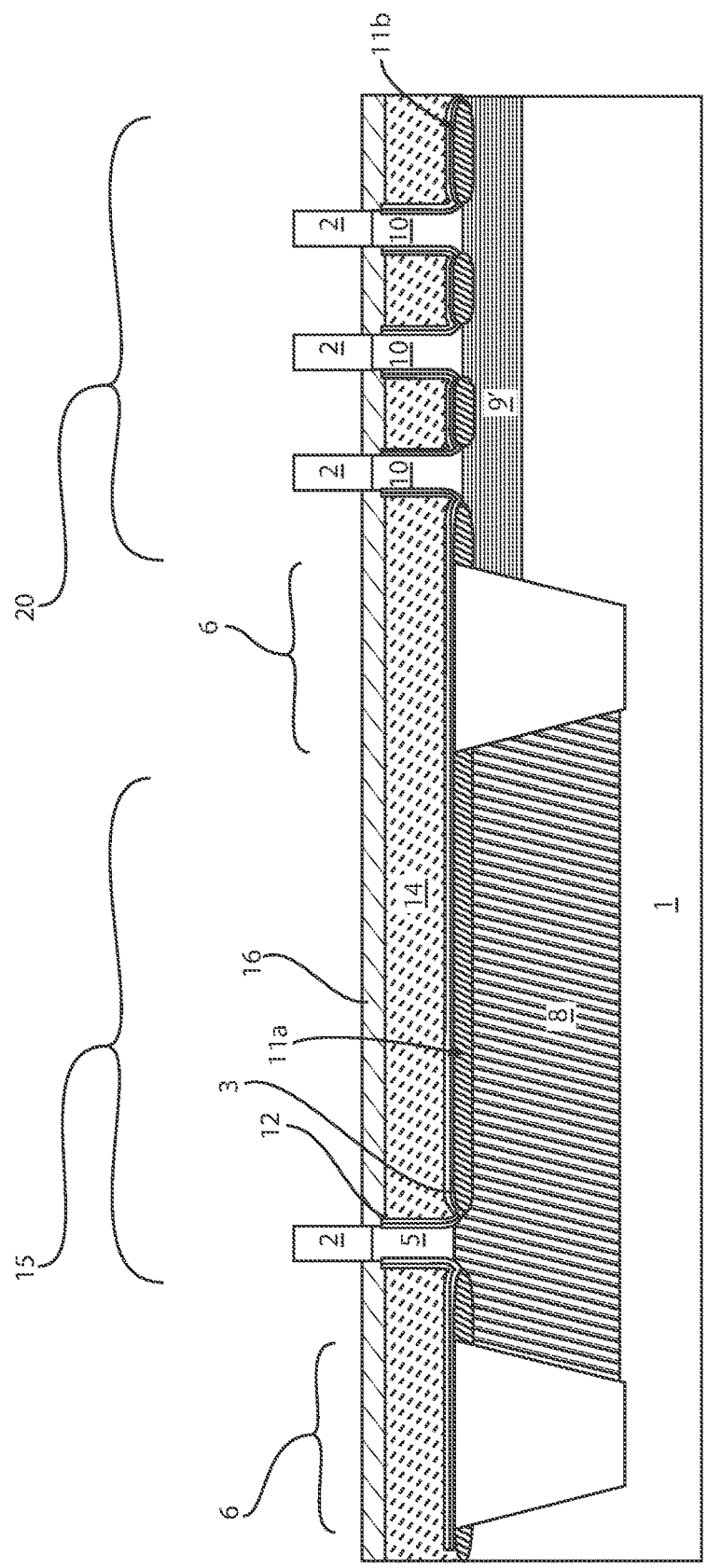
FIG. 8 is a side cross-sectional view depicting forming the material layers for the gate structures for the LDMOS devices and the VFET devices, in accordance with one embodiment of the present disclosure.

FIG. 8 depicts forming the material layers for the gate conductors 14 for the LDMOS devices and the VFET devices. In some embodiments, the material layers for the gate conductors 14 may include a work function metal. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

The material layers for the gate conductors 14 for the LDMOS devices and the VFET devices may also include a metal, such as tungsten (W), tungsten nitride (WN) or combinations thereof.

The material layers for the gate conductors 14 for the LDMOS devices and the VFET devices may be deposited by PVD, CVD or PE-CVD. The PVD methods for forming the gate conductors 14 may include plating, electroplating, electroless plating, sputtering and combinations thereof. In some embodiments, following deposition the material layers for the gate conductor 14 may be recessed to a desired gate height using an etch process. This etch step may be performed using reactive ion etch (RIE). In some embodiments, the gate height may be provided by material layers for the gate conductor 14 having a thickness in the range of about 2 nm to about 5 nm, or in the range of about 2 nm to about 3 nm.

Still referring to FIG. 8, a dielectric spacer layer 16 may be blanket deposited atop the material layer for the gate conductors 14 for the LDMOS devices and the VFET devices. The dielectric spacer layer 16 may be composed of a low-k dielectric material. In various embodiments, the dielectric spacer layer 16 may be composed of the same material as the dielectric layer 11a that is formed on the drift region 8 in the lateral device region 10 and the dielectric layer 11b that provides the first spacer in the vertical device region 15, as described above with reference to FIG. 5. Therefore, the above description of the dielectric layer 11a, 11b depicted in FIG. 5 is suitable for the second spacer layer 16. The second spacer layer 16 may be an oxide. The second spacer layer 16 may be deposited using a chemical vapor deposition process, such as plasma enhanced chemical vapor deposition (PECVD). In other examples, the second spacer layer 16 may be deposited using chemical solution deposition or spin on deposition. In some embodiments, the height of the second spacer layer 16 may be reduced to expose a portion of the cap dielectric 2 that is present on the upper surfaces of the fin structures 5, 10. The height of the second spacer layer 16 may be reduced by etching, such as reactive ion etching (RIE).

Figure 9:
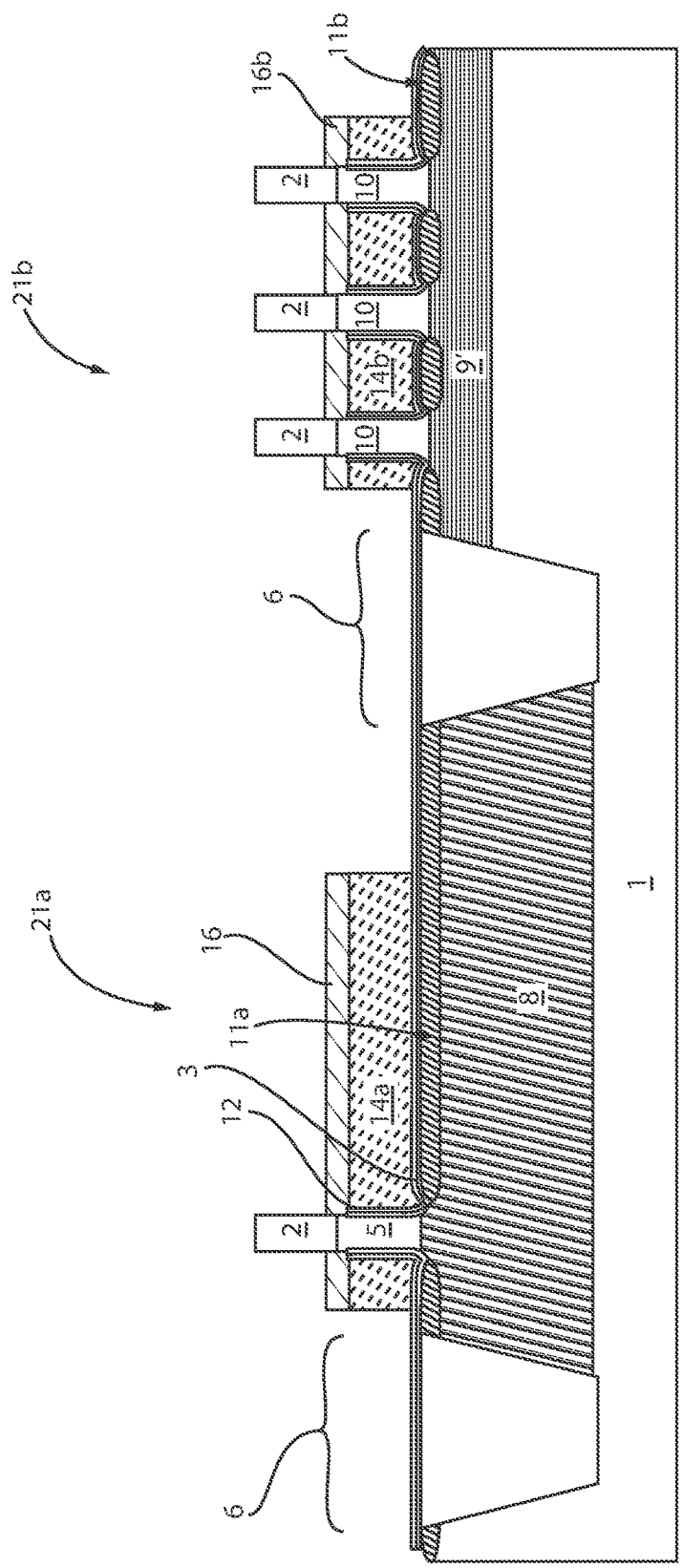
FIG. 9 is a side cross-sectional view depicting patterning the material layer for the gate structures for the LDMOS devices and the VFET devices, in accordance with one embodiment of the present disclosure.

FIG. 9 depicting patterning the material layer 14 for the gate structures 21a, 21b for the LDMOS devices and the VFET devices. The gate structure 21a, 21b can be formed using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. For example, a selective etch process may remove the exposed portions of the second spacer layer 16 and the material layer for the gate conductors 14, wherein the remaining portions of the second spacer layer 16 and the material layer for the gate conductors 14 define the geometry of the gate structures 21a, 21b. Although not depicted in FIG. 9, a dielectric layer may be present filling the space between the gates.

Figure 10:
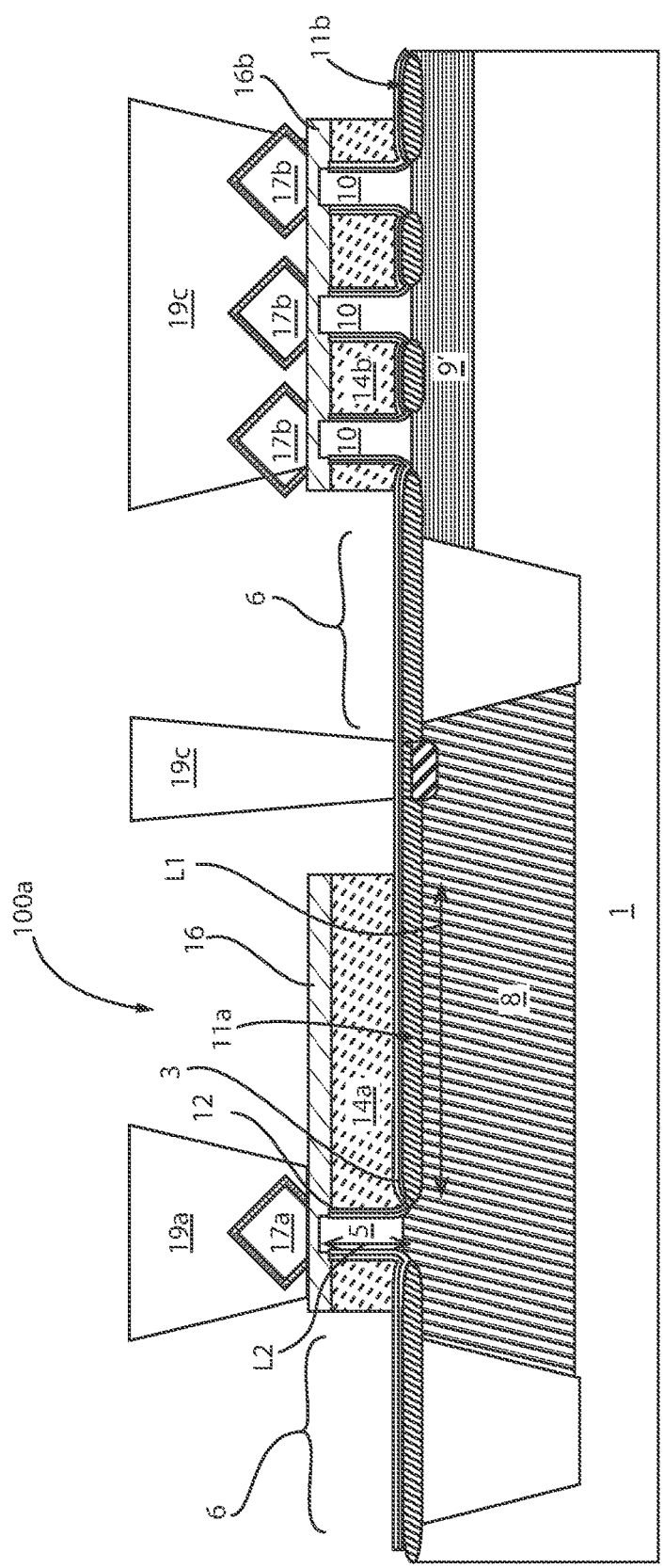
FIG. 10 is a side cross-sectional view depicting forming an epitaxial semiconductor material on the at least one first fin structure in the lateral device region of the substrate and the at least one second fin structure in the vertical device region of the substrate, in accordance with the present disclosure.

FIG. 10 depicts forming an epitaxial semiconductor material 17a on the at least one first fin structure 5 in the lateral device region 15 of the substrate 1, and forming an epitaxial semiconductor material 17b on the at least one second fin structure 10 in the vertical device region 20 of the substrate 1. The epitaxial semiconductor material 17a is typically grown after a dielectric (not depicted) is used to fill in between the gates.

The epitaxial semiconductor material 17a that is formed in the lateral device region 15 may provide the source region for the LDMOS device.

The epitaxial semiconductor material 17b that is formed in the vertical device region 20 may provide the second of a source or a drain region for the VFETS. For example, when the diffused doped region 9' is a source region, the epitaxial semiconductor material 17b provides a drain region formed on the opposing surface, i.e., upper surface of the fin structure 10. In another example, when the diffused doped region 9' is a drain region, the epitaxial semiconductor material 17b provides a source region is formed on the opposing surface, i.e., upper surface of the fin structure 10.

An epitaxial semiconductor material is formed using epitaxial growth. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

Before, forming the epitaxial semiconductor material 17a, 17b, the dielectric cap 2 may be removed to expose the semiconductor surface of the fin structures 5, 10 that provides the deposition surface for the epitaxial deposition process. The dielectric cap 2 may be removed using a selective etch process, such as a wet chemical etch or reactive ion etch. Following removal of the dielectric cap 2, the epitaxial semiconductor material 17a, 17b may be formed.

In some embodiments, the epitaxial semiconductor material 17a, 17b may be composed of silicon. Examples of silicon gas source for epitaxial deposition of a silicon containing drain region 17a, 17b may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2$ $SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$6Si_2$) and combinations thereof. In some embodiments, the epitaxial semiconductor material that provides the drain regions 15a, 15b may be composed of germanium. Examples of germanium gas source for epitaxial deposition may be selected from the group consisting of germane (GeH4), digermane ($Ge_2H_6$), halogermane, dichlorogermane, trichlorogermane, tetrachlorogermane and combinations thereof.

The epitaxial semiconductor material 17a, 17b may be doped to a n-type or p-type conductivity. The dopant for the epitaxial semiconductor material 17a, 17b may be introduced in-situ during the formation of the base material, i.e., epitaxial semiconductor material. The n-type gas dopant source for in-situ doping may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$ PH). The p-type gas dopant source for in-situ doping may include diborane. In other embodiments, the epitaxial semiconductor material 17a, 17b may also be formed using gas phase doping or ion implantation.

It is noted that the epitaxial semiconductor material 17a that is formed in the lateral device region 15 and the epitaxial semiconductor material 17b that is formed in the vertical device region 20 may be composed of the same composition materials or different compositions materials, and may have the same conductivity type or a different conductivity type. Block masks may be used to independently process the lateral device region 15 and the vertical device region 20.

In a following process step, an interlevel dielectric layer (not shown) may be formed over the LDMOS device and the VFET device. The interlevel dielectric layer may be patterned and etched to provide via openings to the LDMOS device within the lateral device region 15 and the VFET in the vertical device region 20. The openings may then be filled with an electrically conductive material, such as a metal, e.g., aluminum, copper, tungsten, titanium, silver, platinum, palladium, tantalum, gold, and combinations thereof, to provide contacts 19a, 19b, 19c.

The contacts to the VFET device in the vertical device region 20 may include a contact to the source region (not shown), a contact to the gate region (not shown), and a contact to the drain region 19c.

The contacts to the LDMOS device in the lateral device region 15 may include a contact 19a to the source region, a contact 19b to the drift region 8, and a contact to the gate structure (not shown).

FIG. 10 depicts one embodiment of an electrical device that can include a substrate 1 having a lateral device region 10 and a vertical device region 20. The substrate 1 may be a bulk substrate. A first semiconductor device 100a, e.g., LDMOS 100a, may be present in the lateral device region 10. The first semiconductor device 100a may include a lateral channel portion that has a length L1 that is parallel to an upper surface of the substrate 1 on which the first semiconductor device is formed. The lateral channel portion may be present in a drift region 8 of an LDMOS semiconductor device. The lateral device region 15 includes at least one first fin structure 5 that is a component of the first semiconductor device, e.g., LDMOS. The at least one fin structure 5 may provide a vertical channel portion having a length L2 that is perpendicular to the upper surface of the substrate 1. The vertical device region 20 includes at least one fin structure 10 that provides the vertical channel for the VFET. The vertical device region 20 does not include a lateral channel.

In some embodiments, the vertical field effect transistor (VFET) device that may be present in the vertical device region 20 includes a first dopant region 9' for a first of a source region and a drain region provided by a doped portion of the substrate 1, and a second doped region for a second of the source region and the drain region provided by an second epitaxial semiconductor material 17b formed on an upper surface of said second fin structure. A first spacer is provided by a first dielectric layer 11a that is present between the gate structure and the first doped region 9', and a second spacer is provided by a dielectric layer 16b atop the gate conductor 14b for the gate structure of the VFET.

In some embodiments, when the first device 100a is provided by an LDMOS device, the LDMOS device includes a drift region 8 provided by a doped portion of the substrate 1 in the lateral device region 10; and a drift region gate dielectric 11a formed on the drift region 8 of the substrate 1. The drift region gate dielectric 11a is the portion of the gate dielectric overlying the lateral length L1 of the channel portion for the LDMOS device. In one embodiment, the drift region gate dielectric 11a, 11c has multiple thickness regions, as depicted in FIG. 6.

Referring to FIG. 10, the drift region gate dielectric 11a is on a same level as the dielectric layer 11b that provides the spacer for the VFET. The LDMOS device also includes a fin gate dielectric 12 present on the fin structure 5 that is present in the lateral device region 10. The fin gate dielectric 12 is the portion of the gate dielectric that is present on the vertical channel portion of the LDMOS having the length L2. The LDMOS gate conductor 14a is present on the drift region gate dielectric 11a and the fin gate dielectric 12. The LDMOS device that is present in the lateral device region 15 includes an epitaxial semiconductor material 17a formed on an upper surface of the fin structure 5. The epitaxial semiconductor material 17a and the drift region 8 are typically doped to a first conductivity type, while the fin structure 5 that is present in the lateral device region 15 is doped to a second conductivity type. For example, the epitaxial semiconductor material 17a and the drift region 8 may be doped to an n-type conductivity, while the fin structure 5 is doped to a p-type conductivity. In another example, the epitaxial semiconductor material 17a and the drift region 8 may be doped to a p-type conductivity, while the fin structure 5 is doped to an n-type conductivity.

Figure 11C:
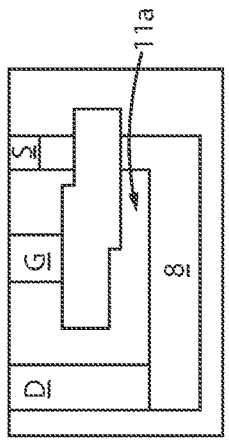
FIG. 11C is a side cross-sectional view of another embodiment of an LDMOS semiconductor device, as depicted in FIG. 11A, in which the drift oxide has two drift oxide thicknesses.
Figure 11B:
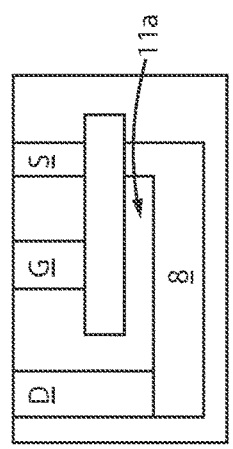
FIG. 11B is a side cross-sectional view of one embodiment of an LDMOS semiconductor device, as depicted in FIG. 11A, in which the drift oxide has a single thickness.
Figure 11A:
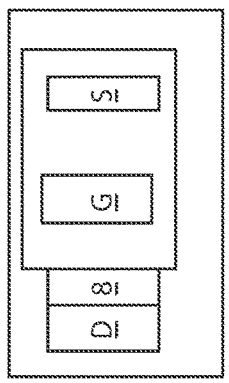
FIG. 11A is a top down view of an LDMOS semiconductor device in accordance with one embodiment of the present disclosure.

A number of geometries may be employed for the LDMOS device that is present in the lateral device region 15. FIGS. 11A and 11B depict one embodiment of an LDMOS semiconductor device including a gate contact on an active region of the device, in which the drift region gate dielectric 11a, i.e., drift oxide, has a single thickness. FIG. 11C depicts another embodiment of an LDMOS semiconductor device, in which the drift region gate dielectric 11a, i.e., drift oxide, has two thicknesses.

Figure 13A:
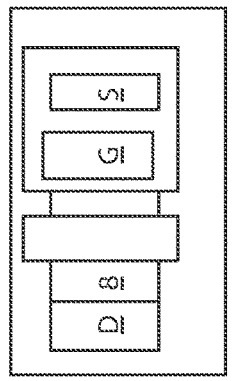
FIG. 13A is a top down view of a split gate LDMOS semiconductor device.
Figure 12B:
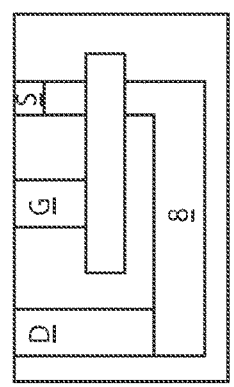
FIG. 12B is a side cross-sectional view of the LDMOS semiconductor device depicted in FIG. 12A.
Figure 13B:
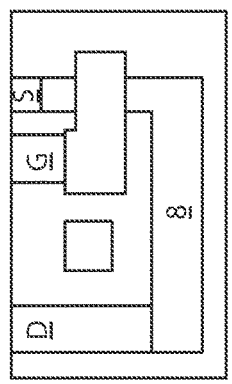
FIG. 13B is a side cross-sectional view of the LDMOS semiconductor device depicted in FIG. 13A.
Figure 12A:
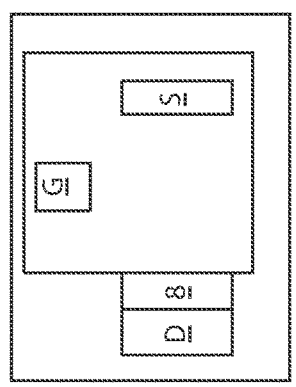
FIG. 12A is a top down view of an LDMOS semiconductor device having a rectangular contact to the gate region, in accordance with one embodiment of the present disclosure.

FIGS. 12A and 12B depict one embodiment of an LDMOS semiconductor device having a rectangular contact to the gate region G, in which the gate region contact is offset from the source and drift region contacts. FIGS. 13A and 13B depict one embodiment of a split gate LDMOS semiconductor device.

Figure 14A:
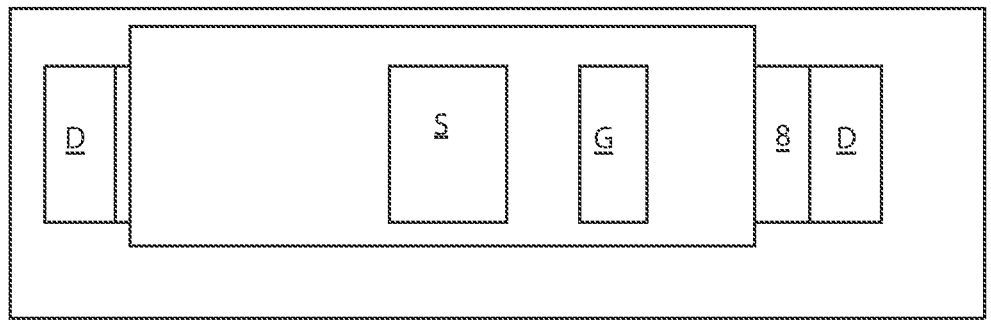
FIG. 14A is a top down view of a symmetrical LDMOS semiconductor device, in accordance with some embodiments of the present disclosure.
Figure 14B:
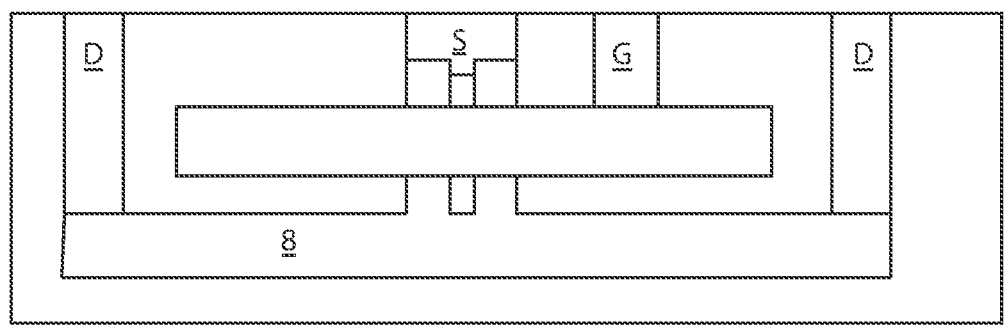
FIG. 14B is a side cross-sectional view of the structure depicted in FIG. 14A, in which the LDMOS device includes two source contacts.
Figure 14C:
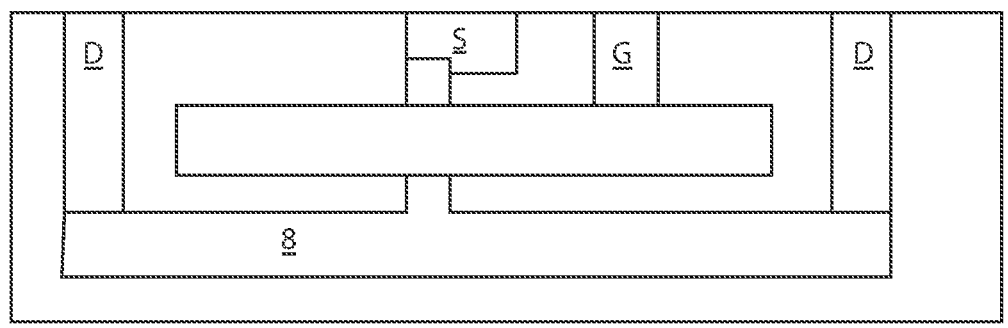
FIG. 14C is a side cross-sectional view of the structure depicted in FIG. 14A, in which the LDMOS device includes a single source contact.
Figure 15A:
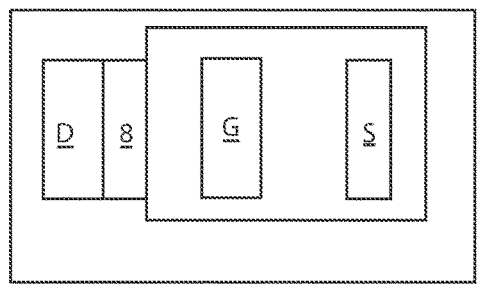
FIG. 15A is a top down view of a LDMOS semiconductor device including an isolation region in the drift region, in accordance with some embodiments of the present disclosure.
Figure 15B:
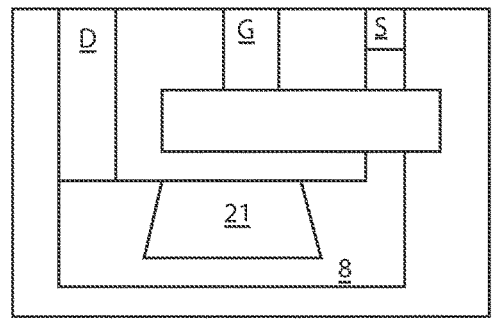
FIG. 15B is a side cross-sectional view of the structure depicted in FIG. 15A.
Figure 16A:
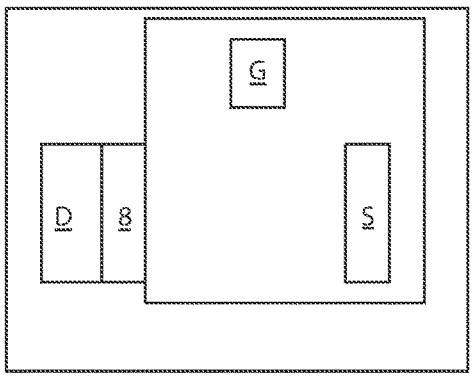
FIG. 16A is a top down view of another embodiment of an LDMOS semiconductor device including an isolation region in the drift region, in which the gate contact is offset from the source contact and the diffusion region contact, in accordance with one embodiment of the present disclosure.
Figure 16B:
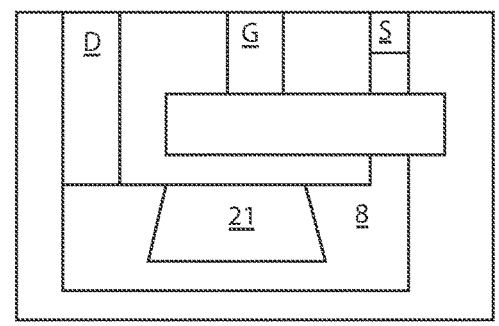
FIG. 16B is a side cross-sectional view of the structure depicted in FIG. 16A.

FIGS. 14A-14C depict some embodiments of symmetrical LDMOS semiconductor devices. FIG. 14B depicts one embodiment of a symmetrical LDMOS device including two source contacts. FIG. 14C depicts one embodiment of a symmetrical LDMOS device including a single source contact. FIGS. 15A and 15B depict one embodiment of an LDMOS semiconductor device including an isolation region 21 in the drift region 8. FIGS. 16A and 16B depict yet another embodiment of an LDMOS semiconductor device including an isolation region 21 in the drift region 9, in which the gate contact is offset from the source contact and the diffusion region contact.

It is noted that each of the embodiments depicted in FIGS. 11A-16B may be integrated into the process flow described above with reference to FIGS. 1-10.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
   a first device in a first device region of a substrate, the first device including at least one first fin structure, and a drift region of the first device having a length that is parallel to an upper surface of the substrate, wherein the first device is a planar semiconductor device; and
   a second device in a second device region, the second device includes at least one second fin structure including a channel region having a length that is perpendicular to said upper surface of the substrate, the second device including a gate structure that is positioned around the channel region, wherein the second device further comprises a first of a source region and a drain region provided by a doped portion of the substrate, and a second device gate structure present on the channel region, wherein the second device further includes a spacer provided by a dielectric layer formed on the doped portion of the substrate.

2. The electrical device of claim 1, wherein a second of the source region and the drain region is provided by a second epitaxial semiconductor material formed on an upper surface of said second fin structure.

3. The electrical device of claim 1, wherein the planar semiconductor device includes a channel region in the first fin structure, the channel region having a length that is parallel to an upper surface of the semiconductor substrate.

4. The electrical device of claim 3, wherein the planar semiconductor device is a lateral diffusion metal oxide semiconductor (LDMOS) device that comprises:
   a drift region provided by a doped portion of the substrate;
   a drift region gate dielectric formed on the drift region of the substrate; wherein the drift region gate dielectric is on a same level as the dielectric layer that provides the spacer;
   a fin gate dielectric present on the first fin structure;
   an LDMOS gate structure present on the drift region gate dielectric and the fin gate dielectric; and
   a first epitaxial semiconductor material formed on an upper surface of said first fin structure.

5. The electrical device of claim 4, wherein the LDMOS gate structure comprises a conformal gate dielectric and a first gate electrode.

6. The electrical device of claim 5, wherein the drift region gate dielectric has multiple thickness regions.

7. An electrical device comprising:
   a first device in a first device region of a substrate including a drift region having a length that is parallel to an upper surface of the substrate, wherein the first device is a planar semiconductor device; and
   a second device in a second device region including a channel region having a length that is perpendicular to said upper surface of the substrate, the second device including a gate structure that is positioned around the channel region, wherein the second device further comprises one of a source region and a drain region provided by a doped portion of the substrate, and a second device gate structure present on the channel region, wherein the second device further includes a spacer provided by a dielectric layer formed on the doped portion of the substrate, wherein a second of the source region and the drain region is provided by an epitaxial semiconductor material formed on an upper surface of the channel region.

8. The electrical device of claim 7, wherein a channel region for the planar semiconductor device has a length that is parallel to an upper surface of the semiconductor substrate.

9. The electrical device of claim 8, wherein the planar semiconductor device is a lateral diffusion metal oxide semiconductor (LDMOS) device that comprises:
the drift region provided by a doped portion of the substrate;
a drift region gate dielectric formed on the drift region of the substrate, wherein the drift region gate dielectric is on a same level as the dielectric layer that provides the spacer;
a gate dielectric present on the channel region; and
an LDMOS gate structure present on the drift region gate dielectric and the gate dielectric on the channel region.

10. The electrical device of claim 9, wherein the LDMOS gate structure comprises a conformal gate dielectric and a first gate electrode.

11. The electrical device of claim 10, wherein the drift region gate dielectric has multiple thickness regions.

12. An electrical device comprising:
a first device in a first device region of a substrate, the first device including at least one first fin structure, and a drift region of the first device has a length that is parallel to an upper surface of the substrate, wherein the drift region is provided by a doped portion of the substrate in the first device region, a drift region gate dielectric is present on the drift region of the substrate, a fin gate dielectric present on the first fin structure, and a first device gate structure present on the drift region gate dielectric and the fin gate dielectric; and a second device in a second device region, the second device includes at least one second fin structure including a channel region having a length that is perpendicular to said upper surface of the substrate, wherein the second device further includes a spacer provided by a dielectric layer formed on the doped portion of the substrate, and the first device and the second device each comprise source and drain regions comprised of epitaxial semiconductor material formed on source and drain region portions of the first fin structure and the second fin structure.

13. The electrical device of claim 12, wherein the drift region gate dielectric is on a same level as the dielectric layer that provides the spacer.

* * * * *